United States Patent [19]
Fan et al.

[11] Patent Number: 5,926,715
[45] Date of Patent: Jul. 20, 1999

[54] METHOD OF FORMING LIGHTLY-DOPED DRAIN BY AUTOMATIC PSG DOPING

[75] Inventors: Der-Tsyr Fan; Liang-Choo Hsia, both of Taipei Hsien; Jr-Min Tsaur, Miaoli, all of Taiwan

[73] Assignee: Mosel Vitelic Inc., Hsinchu, Taiwan

[21] Appl. No.: 08/868,427

[22] Filed: Jun. 4, 1997

[51] Int. Cl.$^6$ .................................................. H01L 21/336
[52] U.S. Cl. ........................ 438/305; 438/307; 438/563
[58] Field of Search .................................... 438/305, 563, 438/307

[56] References Cited

U.S. PATENT DOCUMENTS 5,273,934  12/1993  Ehinger et al. .
5,478,776  12/1995  Luftman et al. .
5,504,024   4/1996  Hsu .
5,599,734   2/1997  Byun et al. .
5,696,016  12/1997  Chen et al. .
5,747,378   5/1998  Fan et al. ................................ 438/563

*Primary Examiner*—Richard A Booth
*Attorney, Agent, or Firm*—Knobbe, Martens, Olson & Bear, LLP

[57] ABSTRACT

A method of forming a LDD fabrication by automatic phosphoric silicate glass (PSG) doping is disclosed herein. A phosphoric silicate glass serves as a diffusion source. The phosphorous ions of phosphoric silicate glass can be driven into a substrate to form a lightly-doped drain (LDD)by a high temperature during a thermal annealing process. The diffusion method can prevent from the damage in the substrate and the increasing of leakage current. Additionally, a thermal oxide layer is formed on the gate electrode and the surface of the substrate by the thermal oxidation process. The thermal oxide layer can prevent ions from sequentially diffusing into the substrate during the subsequent thermal treatment process. Therefore, the present invention can effectively control the impurity concentration of the lightly-doped drain (LDD) to prevent from the impurity concentration of the LDD over high.

18 Claims, 8 Drawing Sheets

METHOD OF FORMING LIGHTLY-DOPED DRAIN BY AUTOMATIC PSG DOPING

BACKGROUND OF THE INVENTION

1. Field of the Invention

The present invention relates to a lightly-doped drain (LDD) fabrication, and more particularly, to a method of forming LDD by automatic phosphoric silicate glass (PSG) doping.

2. Description of the Prior Art

In the semiconductor process, there is a problem about "hot electron effect" induced by short channel MOS transistor. The problem is solved by implanting impurities to form the lightly-doped regions. The implantation impurity concentration of the lightly-doped regions is lower than the original source/drain regions. The lightly-doped regions mainly prevent hot electron effect and serve as the LDD (lightly-doped drain).

In a conventional LDD fabrication, there are-typically two methods used as follow:

The first method is used by an ion implantation to form the LDD. Referring to FIG. 1A, an isolation process such as a standard LOCOS (Local Oxidation of Silicon) is performed. Then, field oxide layers (FOX) 102 are formed on a substrate 100 to define an active area 104. A gate oxide layer 106 and a polysilicon layer 108 are sequentially formed over the substrate 100 and on the field oxide layers (FOX) 102. A photoresist 110 is patterned on the polysilicon layer 108, covering a portion of the top surface of the polysilicon layer 108 to define a gate electrode region.

Referring to FIG. 1B, an etching process is performed by using the photoresist 110 as an etching mask. The unmasked portion of the polysilicon layer 108 is etched to the surface of the gate oxide layer 106. After the etching process, a gate electrode 112 is formed. Next, the photoresist 110 is removed. The gate oxide layer 106 can reduce ions to collide with the silicon atoms in the substrate during the subsequent ion implantation process. The ions will not be deeply driven into the substrate to form "channeling effect".

Afterwards, referring to FIG. 1C, the gate oxide layer 106 and the field oxide layers 102 are utilized as the shielding mask for implanting impurities into the substrate. Next, a thermal annealing. process is performed to form lightly-doped regions 114.

Afterwards, referring to FIG. 1D, a dielectric layer 116 is formed on the gate electrode 112 and the gate oxide layer 106.

Next, referring to FIG. 1E, an anisotropic etching process, such as a reactive ion etch, is performed to etch the dielectric layer 116, forming sidewall spacers 118 on the sidewalls of the gate electrode 112. The sidewall spacers 118 and the gate electrode 112 are utilized as the shielding mask for implanting impurities to form the heavily-doped regions, thereby forming the source/drain regions 120.

Accordingly, the conventional ion implantation method will usually cause the damage of the substrate 100, and increase the leakage current. Additionally, the lightly-doped regions (LDD) 114 are formed by using the thermal annealing process to diffuse impurities into the substrate 100. Therefore, the conventional method can not effectively control the diffusing depth of impurities and the concentration distribution of impurities.

Another method uses a phosphoric silicate glass (PSG) as a diffusion source. The ions of phosphoric silicate glass (PSG) are driven into the substrate by a thermal treatment process to form the lightly-doped regions (LDD). Referring to FIG. 2A, after an isolation process such as a standard LOCOS (Local Oxidation of Silicon) is performed, field oxide layers (FOX) 202 are formed on a substrate 200 to define an active area 204. A gate oxide layer 206 and a polysilicon layer 208 are sequentially formed over the substrate 200 and on the field oxide layers (FOX) 202. A photoresist 210 is patterned on the polysilicon layer 208, covering a portion of the top surface of the polysilicon layer 208 to define a gate electrode region.

Referring to FIG. 2B, an etching process is performed by using the photoresist 210 as an etching mask. The unmasked portions of the gate oxide layer 206 and the polysilicon layer 208 are etched to the surface of the substrate 200. After the etching process, a gate electrode 212 is formed. Next, the photoresist 210 is removed.

Referring to FIG. 2C, a phosphoric silicate glass (PSG) 214 is formed on the gate electrode 212 and the substrate 200 by a chemical vapor deposition process. Thereafter, a thermal annealing process is performed. The phosphorous (P) ions of the phosphoric silicate glass (PSG) 214 are driven into the substrate 200 to form the lightly-doped regions (LDD) 216.

Referring to FIG. 2D, an anisotropic etching process, such as a reactive ion etch, is performed. Then, sidewall spacers 218 are formed on the sidewalls of the gate electrode 212 by etching the phosphoric silicate glass (PSG) 214. The sidewall spacers 218 and the gate electrode 212 are utilized as the shielding mask for implanting impurities to form the heavily-doped regions, thereby forming the source/drain regions 220.

Accordingly, the method uses the phosphoric silicate glass (PSG) 214 as a diffusion source to form the lightly-doped drain (LDD) 216. The ions of phosphoric silicate glass (PSG) 214 will still sequentially be driven into the substrate 200 during the subsequent thermal treatment process, for example, the annealing process or the flow process of dielectric planarization. Therefore, the impurity concentration of the lightly-doped regions 216 will increase. Additionally, the conventional method also can not effectively control the diffusing depth of impurities and the concentration distribution of impurities. Therefore, the subsequent compensation of implanting impurities to form a preferred lightly-doped regions will be very difficult to perform.

SUMMARY OF THE INVENTION

It is a primary object of the present invention to provide a method of forming lightly-doped drain by automatic phosphoric silicate glass (PSG) doping. The method can prevent the damage of the substrate induced by the ion implantation, and prevent the leakage current form increasing.

It is another object of the present invention to provide a method of forming lightly-doped drain by automatic phosphoric silicate glass (PSG) doping. The method can prevent ions of the phosphoric silicate glass from sequentially driving into the substrate during the subsequent thermal treatment process. Therefore, the present invention can effectively control the impurity concentration of lightly-doped drain.

Accordingly, the present invention provides a method of forming lightly-doped drain by automatic phosphoric silicate glass (PSG) doping. A phosphoric silicate glass (PSG) serves as a diffusion source to drive the phosphorous (P) ions of the phosphoric silicate glass (PSG) into the substrate by an annealing thermal treatment process. A thermal oxide layer is formed on the surface of the substrate and the gate electrode by a thermal oxidation process. The thermal oxide layer can prevent the phosphorous (P) ions of the phosphoric silicate glass (PSG) from diffusing into the substrate. The present invention includes three preferred embodiment described as follow:

The first preferred embodiment includes the steps of forming field oxide layers on a substrate to define an active area by using the isolation process such as LOCOS. Next, A gate oxide layer is formed on the substrate. A polysilicon layer is formed on the gate oxide layer. Next, a photoresist is patterned on the polysilicon layer, covering a portion of the top surface of the polysilicon layer to define a gate electrode region. An etching process is performed using the photoresist as an etching mask. The unmasked portions of the gate oxide layer and the polysilicon layer are etched to the surface of the substrate to form a gate electrode. After the photoresist is removed, a phosphoric silicate glass (PSG) is formed on the gate electrode and the substrate. Next, the phosphorous (P) ions of the phosphoric silicate glass (PSG) are driven into the substrate by an annealing thermal treatment process to form the lightly-doped regions(LDD). Afterwards, a thermal oxide layer is formed on the gate electrode and the substrate by a dry thermal oxidation process. Sidewall spacers are formed on the sidewalls of the gate electrode by an anisotropic etching process to etch the phosphoric silicate glass (PSG). Next, sidewall spacers and the gate electrode are utilized as the shielding mask for implanting impurities to form the heavily-doped regions, thereby forming the source/drain regions.

The second preferred embodiment includes the steps: After the isolation process such as LOCOS is performed, field oxide layers are formed on a substrate to define an active area. A gate oxide layer and a polysilicon layer are sequentially formed over the substrate. Next, a photoresist is patterned on the polysilicon layer to define a gate electrode region. A gate electrode is formed by using the photoresist as an etching mask to etch portions of the gate oxide layer and the polysilicon layer. After the photoresist is removed, a phosphoric silicate glass (PSG) is formed on the gate electrode and the substrate. Next, the phosphorous (P) ions of the phosphoric silicate glass (PSG) are driven into the substrate by an annealing thermal treatment process to form the lightly-doped regions(LDD). After an anisotropic etching process is performed to etch the phosphoric silicate glass (PSG), sidewall spacers are formed on the sidewalls of the gate electrode. Afterwards, a thermal oxide layer is formed on the gate electrode and the substrate by a dry thermal oxidation process. Next, the heavily-doped regions serving as the source/ drain regions are formed by using sidewall spacers and the gate electrode as the shielding mask for implanting impurities.

The third preferred embodiment includes the steps: Field oxide layers are formed on a substrate to define an active area by using the isolation process such as LOCOS. A gate oxide layer and a polysilicon layer are sequentially formed over the substrate. Next, a photoresist is patterned on the polysilicon layer to define a gate electrode region. A gate electrode is formed by using the photoresist as an etching mask to etch portions of the gate oxide layer and the polysilicon layer. After the photoresist is removed, a phosphoric silicate glass (PSG) is formed on the gate electrode and the substrate. Sidewall spacers are formed on the sidewalls of the gate electrode by an anisotropic etching process to etch the phosphoric silicate glass (PSG). Afterwards, the phosphorous (P) ions of the phosphoric silicate glass (PSG) are driven into the substrate by an annealing thermal treatment process to form the lightly-doped regions(LDD). Next, a thermal oxide layer is formed on the gate electrode and the substrate by a dry thermal oxidation process. Next, sidewall spacers and the gate electrode are utilized as the shielding mask for implanting impurities to form the heavily-doped regions, thereby forming the source/drain regions.

BRIEF DESCRIPTION OF THE DRAWINGS

Various embodiments are described herein with reference to the drawings, wherein.

DESCRIPTION OF THE PREFERRED EMBODIMENT

Figure 1A:
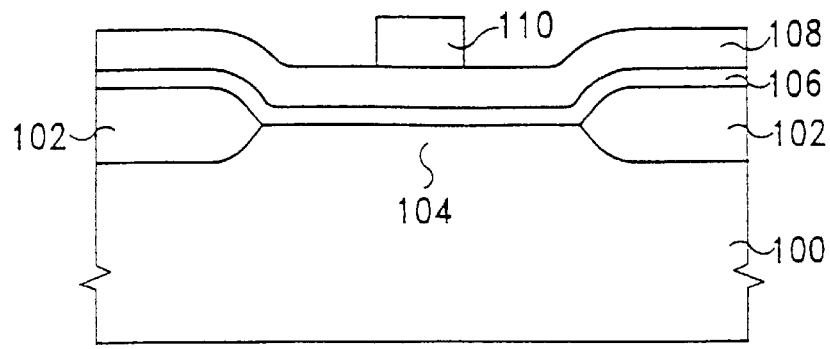
FIG. 1A to FIG. 1E are cross-sectional views of a semiconductor wafer illustrating the steps of forming lightly-doped grain by-using an ion implantation process, according to a conventional method.
Figure 1B:
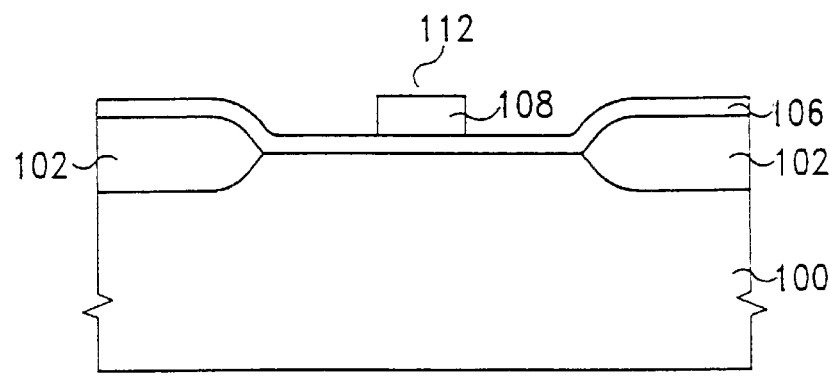
Figure 1C:
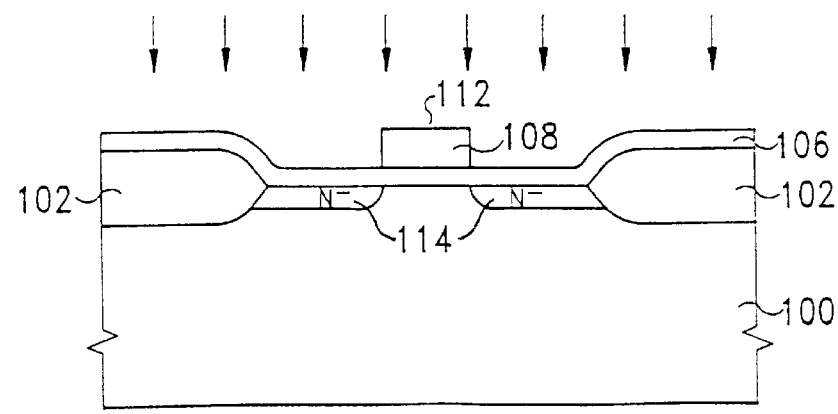
Figure 1D:
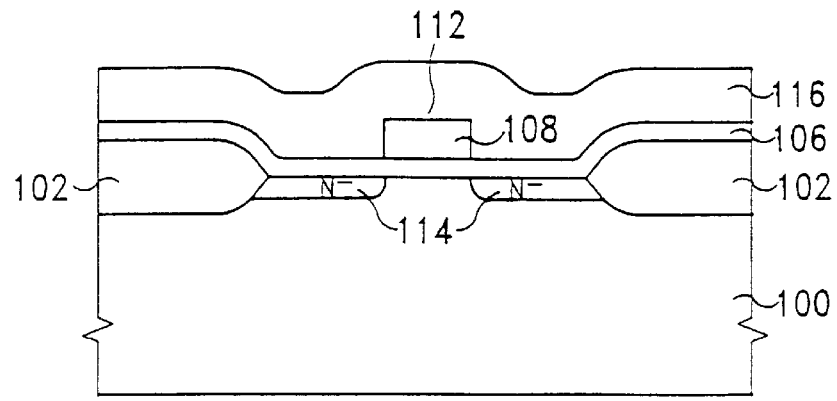
Figure 1E:
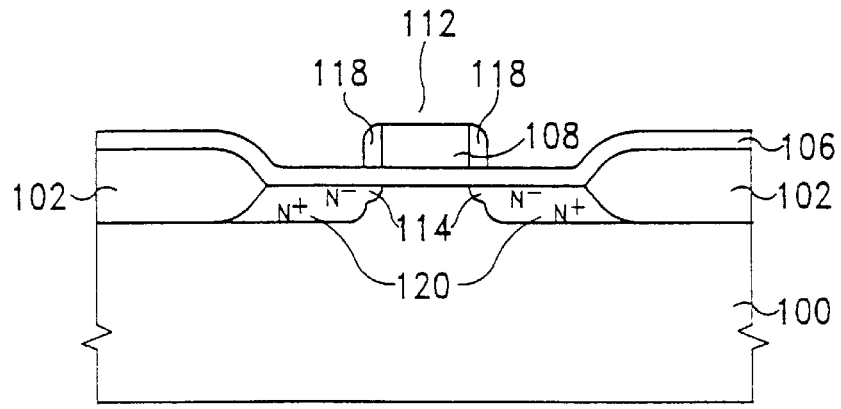
Figure 2A:
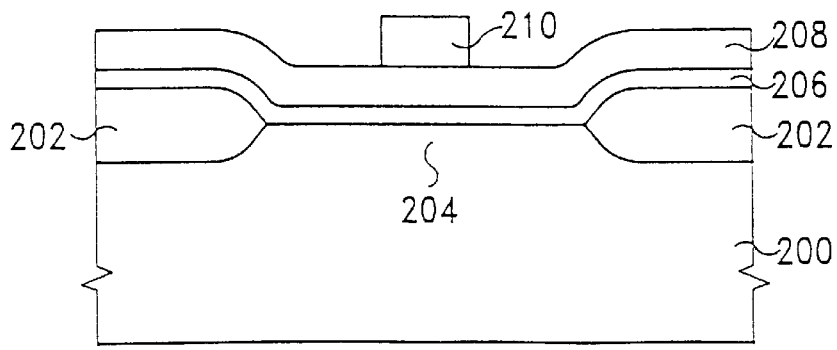
FIG. 2A to FIG. 2D are cross-sectional views of a semiconductor wafer illustrating the steps of forming lightly-doped drain by using a phosphoric silicate glass (PSG) as a diffusion source, according to another conventional method.
Figure 2B:
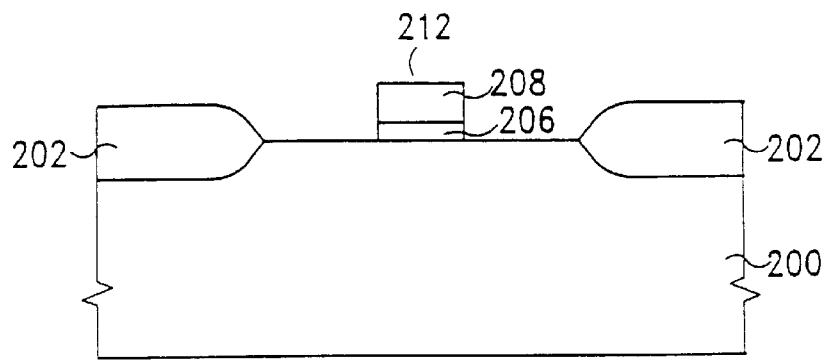
Figure 2C:
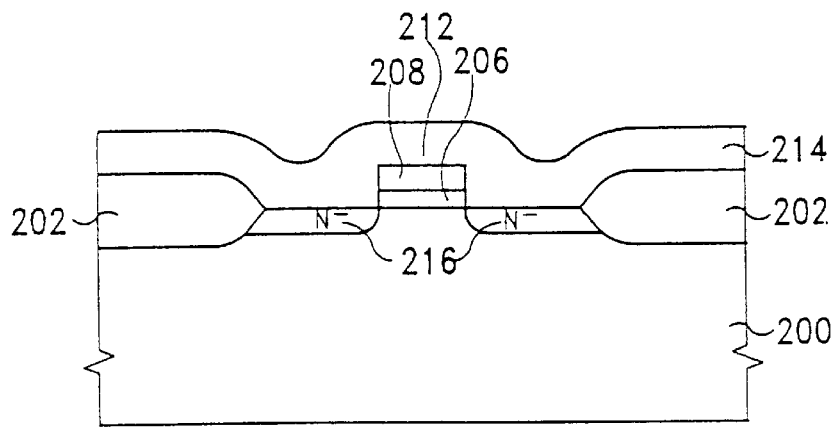
Figure 2D:
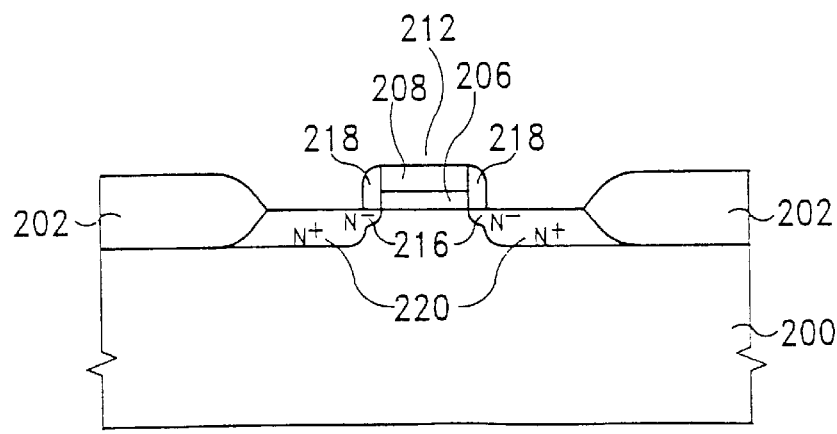
Figure 3A:
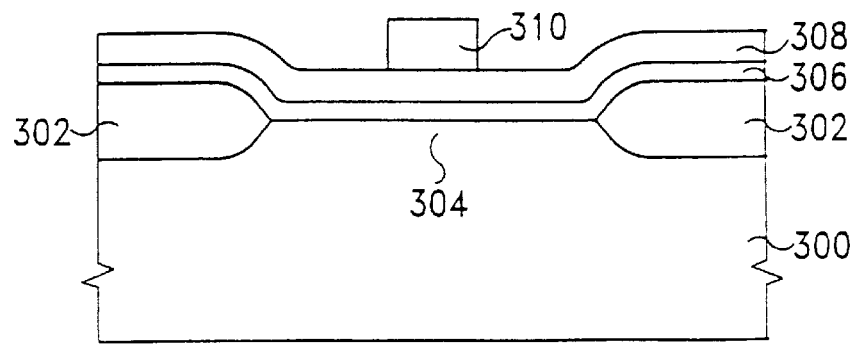
FIG. 3A to FIG. 3E are cross-sectional views of a semiconductor wafer illustrating the steps of forming lightly-doped drain, according to the first preferred embodiment of the present invention.

The first preferred embodiment of the present invention is disclosed herein. Referring to FIG. 3A, an isolation process such as a well-known LOCOS (Local Oxidation of Silicon process) is performed. Then, field oxide layers 302 are formed on a substrate 300 to define an active area 304. A gate oxide layer 306 is formed on the substrate 300 by a thermal oxidation process. The thickness of the gate oxide layer 306 can range from about 40 to 200 angstroms. A polysilicon layer 308 is formed on the gate oxide layer 306 to have a thickness about 500 to 3000 angstroms by a conventional chemical vapor deposition process. Next, a photoresist 310 is patterned on the polysilicon layer 308, covering a portion of the top surface of the polysilicon layer 308 to define a gate electrode region.

Figure 3B:
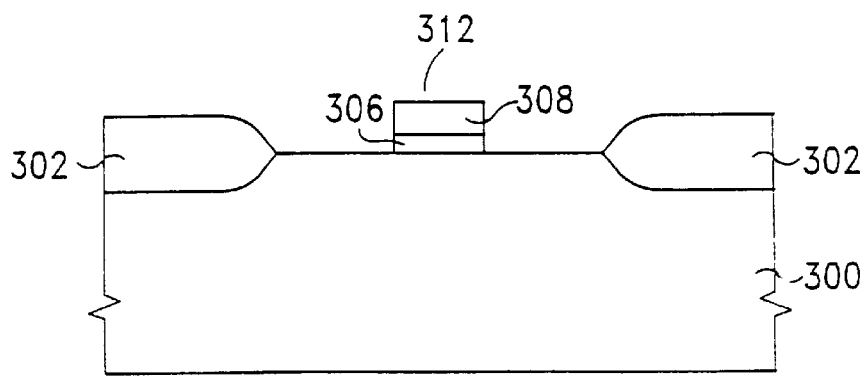

Referring to FIG. 3B, an etching process is performed by using the photoresist 310 as an etching mask. The unmasked portions of the gate oxide layer 306 and the polysilicon layer 308 are etched to the surface of the substrate 300 to form a gate electrode 312. Next, the photoresist 310 is stripped away.

Figure 3C:
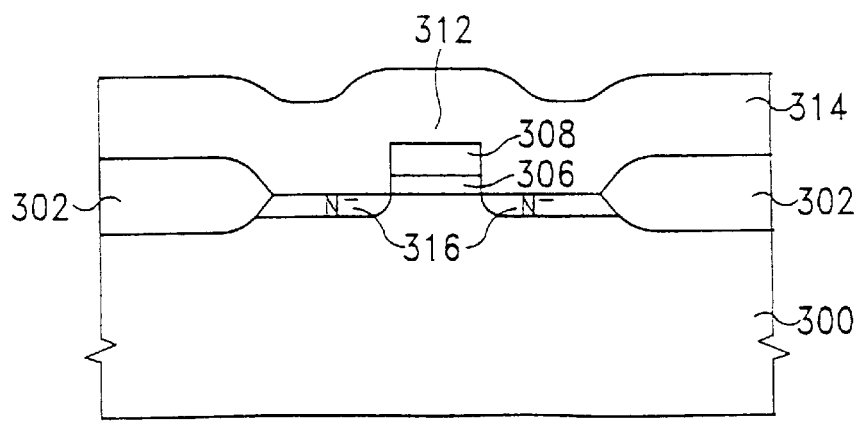

Referring to FIG. 3C, a phosphoric silicate glass (PSG) 314 is formed on the gate electrode 312 and the substrate 300 by using a chemical vapor deposition process. The thickness of the phosphoric silicate glass (PSG) 314 can range from about 200 to 2000 angstroms. Afterwards, a thermal treatment process, such as a rapid thermal annealing or a furnace annealing, is performed. The phosphorous (P) ions in the phosphoric silicate glass (PSG) 314 are driven into the substrate 300 to form the lightly-doped regions (LDD) 316. The impurity concentration of the lightly-doped regions (LDD) 316 is about $10^{17}$ atoms/cm$^3$ to $10^{19}$ atoms/cm$^3$.

Figure 3D:
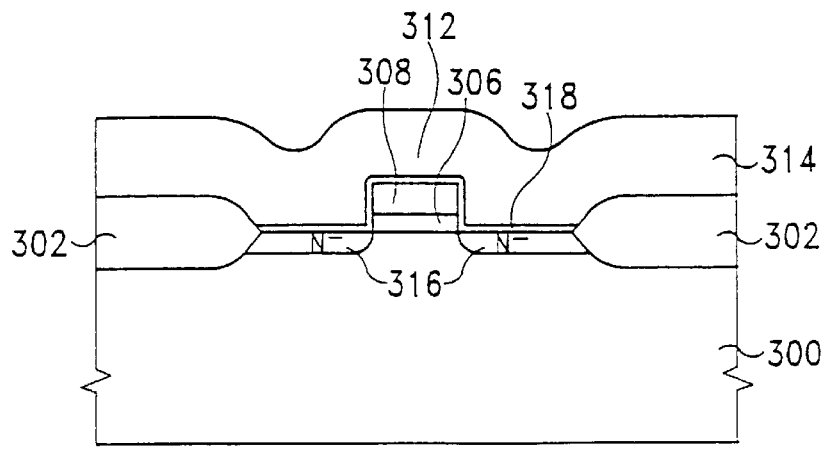

Referring to FIG. 3D, a thermal oxide layer 318 is formed on the gate electrode 312 and the substrate 300 using a dry thermal oxidation process. The temperature of the oxidation is about 800 degrees Centigrade to 1100 degrees Centigrade, and the time of the oxidation is about 30 seconds to 1 hour. The thickness of the thermal oxide layer 318 can range from about 100 to 200 angstroms. The thermal oxide layer 318 can prevent the phosphorous (P) ions of the phosphoric silicate glass (PSG) from sequentially diffusing into the substrate. Therefore, the first method can effectively control impurity concentration of the lightly-doped regions (LDD).

Figure 3E:
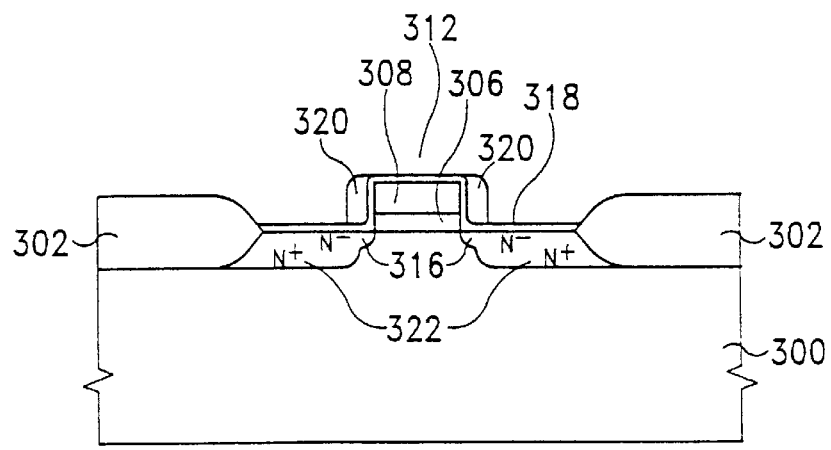

Referring to FIG. 3E, sidewall spacers 320 are formed on the sidewalls of the gate electrode 312 by an anisotropic etching process to etch the phosphoric silicate glass (PSG) 314. Next, sidewall spacers 320 and the gate electrode 312 are utilized as the shielding mask for implanting impurities to form the heavily-doped regions, thereby forming the source/ drain regions 322.

Figure 4A:
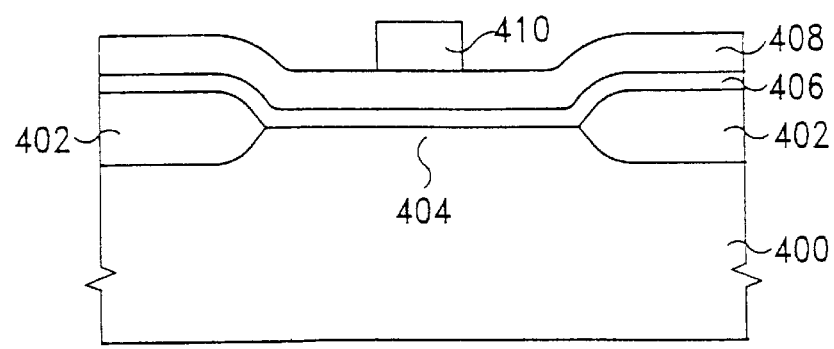
FIG. 4A to FIG. 4E are cross-sectional views of a semiconductor wafer illustrating the steps of forming lightly-doped drain, according to the second preferred embodiment of the present invention.

The second preferred embodiment of the present invention is disclosed herein. Referring to FIG. 4A, an isolation process such as a well-known LOCOS (Local Oxidation of Silicon process) is performed. Field oxide layers 402 are then formed on a substrate 400 to define an active area 404. A gate oxide layer 406 is formed on the substrate 400 by a thermal oxidation process. The thickness of the gate oxide layer 406 can range from about 40 to 200 angstroms. A polysilicon layer 408 is formed on the gate oxide layer 406 to have a thickness about 500 to 3000 angstroms by a conventional chemical vapor deposition process. Next, a photoresist 410 is patterned on the polysilicon layer 408, covering a portion of the top surface of the polysilicon layer 408 to define a gate electrode region.

Figure 4B:
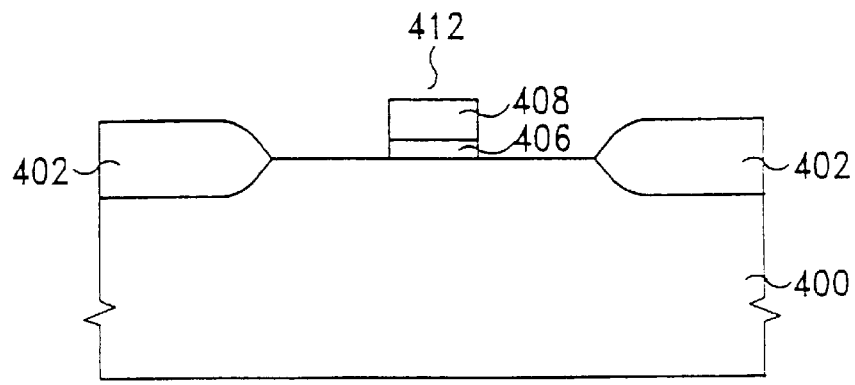

Referring to FIG. 4B, an etching process is performed by using the photoresist 410 as an etching mask. The unmasked portions of the gate oxide layer 406 and the polysilicon layer 408 are etched to the surface of the substrate 400 to form a gate electrode 412. Next, the photoresist 410 is stripped away.

Figure 4C:
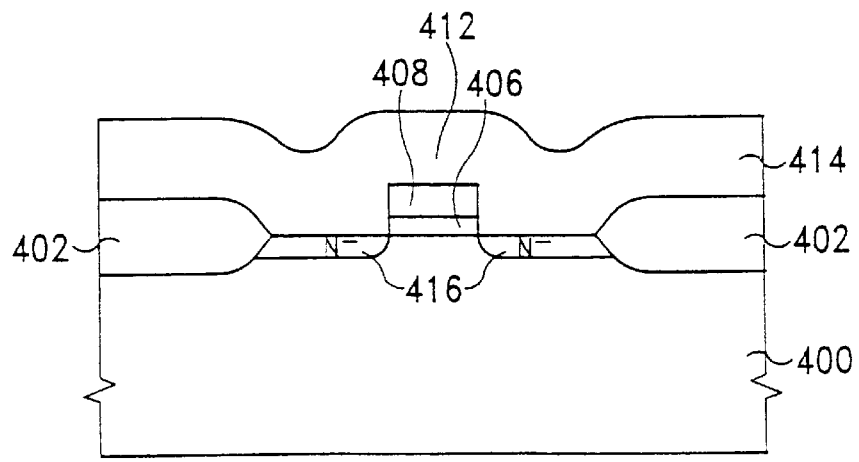

Referring to FIG. 4C, a phosphoric silicate glass (PSG) 414 is formed on the gate electrode 412 and the substrate 400 by using a chemical vapor deposition process. The thickness of the phosphoric silicate glass (PSG) 414 can range from about 200 to 2000 angstroms. Afterwards, a thermal treatment process, such as a rapid thermal annealing or a furnace annealing, is performed. The phosphorous (P) ions in the phosphoric silicate glass (PSG) 414 are driven into the substrate 400 to form the lightly-doped regions (LDD) 416. The impurity concentration of the lightly-doped regions (LDD) 416 is about $10^{17}$ atoms/cm$^3$ to $10^{19}$ atoms/cm$^3$.

Figure 4D:
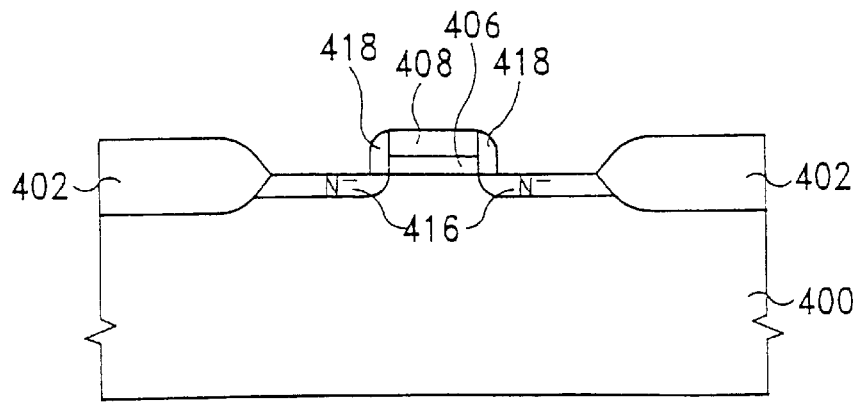

Referring to FIG. 4D, sidewall spacers 418 are formed on the sidewalls of the gate electrode 412 by an anisotropic etching process to etch the phosphoric silicate glass (PSG) 414.

Figure 4E:
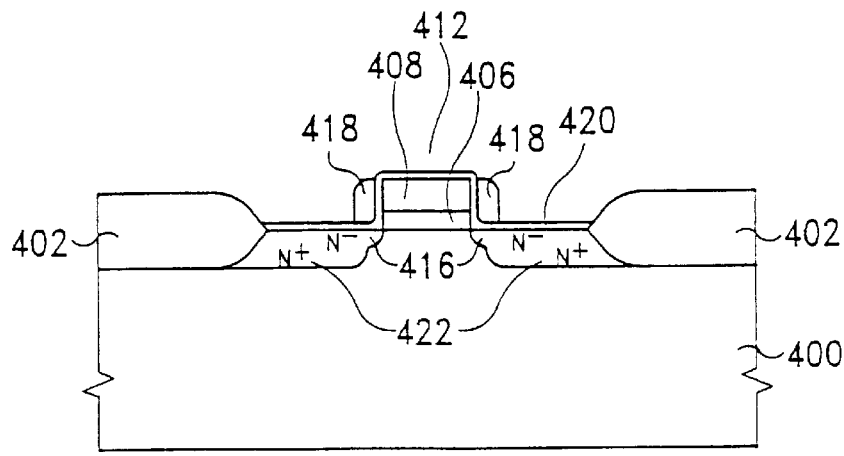

Referring to FIG. 4E, a thermal oxide layer 420 is formed on the gate electrode 412 and the substrate 400 using a dry thermal oxidation process. The temperature of the oxidation is about 800 degrees Centigrade to 1100 degrees Centigrade, and the time of the oxidation is about 30 seconds to 1 hour. The thickness of the thermal oxide layer 420 can range from about 100 to 200 angstroms. The thermal oxide layer 420 can prevent the phosphorous (P) ions of sidewall spacers 418 from sequentially diffusing into the substrate. Therefore, the second method can effectively control impurity concentration of the lightly-doped regions (LDD). Next, sidewall spacers 418 and the gate electrode 412 are utilized as the shielding mask for implanting impurities to form the heavily-doped regions, thereby forming the source/drain regions 422.

Figure 5A:
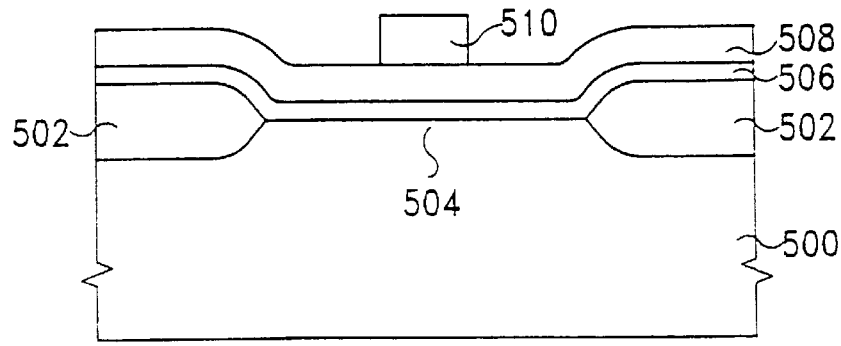
FIG. 5A to FIG. 5E are cross-sectional views of a semiconductor wafer illustrating the steps of forming lightly-doped drain, according to the third preferred embodiment of the present invention.

The third preferred embodiment of the present invention is disclosed herein. Referring to FIG. 5A, an isolation process such as a well-known LOCOS (Local Oxidation of Silicon process) is performed. Then, field oxide layers 502 are formed on a substrate 500 to define an active area 504. A gate oxide layer 506 is formed on the substrate 500 by a thermal oxidation process. The 6 thickness of the gate oxide layer 506 can range from about 40 to 200 angstroms. A polysilicon layer 508 is formed on the gate oxide layer 506 to have a thickness about 500 to 3000 angstroms by a conventional chemical vapor deposition process. Next, a photoresist 510 is patterned on the polysilicon layer 508, covering a portion of the top surface of the polysilicon layer 508 to define a gate electrode region.

Figure 5B:
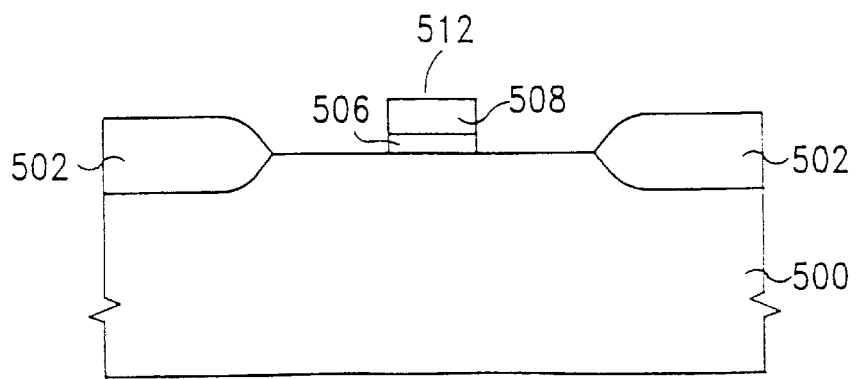

Referring to FIG. 5B, an etching process is-performed by using the photoresist 510 as an etching mask. The unmasked portions of the gate oxide layer 506 and the polysilicon layer 508 are etched to the surface of the substrate 500 to form a gate electrode 512. Next, the photoresist 510 is stripped away.

Figure 5C:
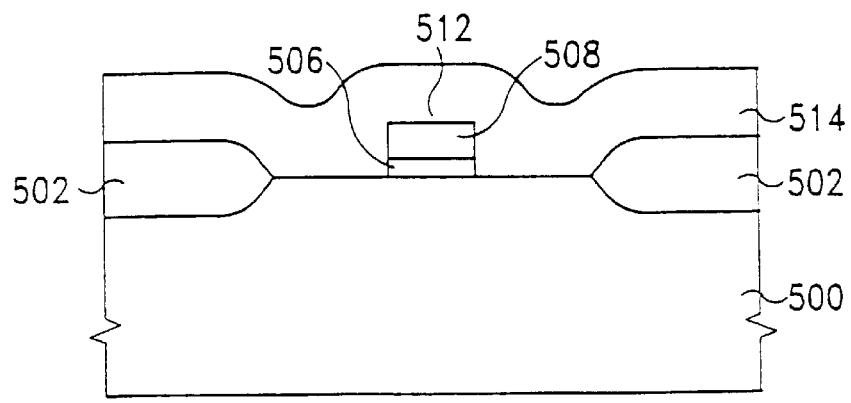

Referring to FIG. 5C, a phosphoric silicate glass (PSG) 514 is formed on the gate electrode 512 and the substrate 500 by using a chemical vapor deposition process. The thickness of the phosphoric silicate glass (PSG) 514 can range from about 200 to 2000 angstroms.

Figure 5D:
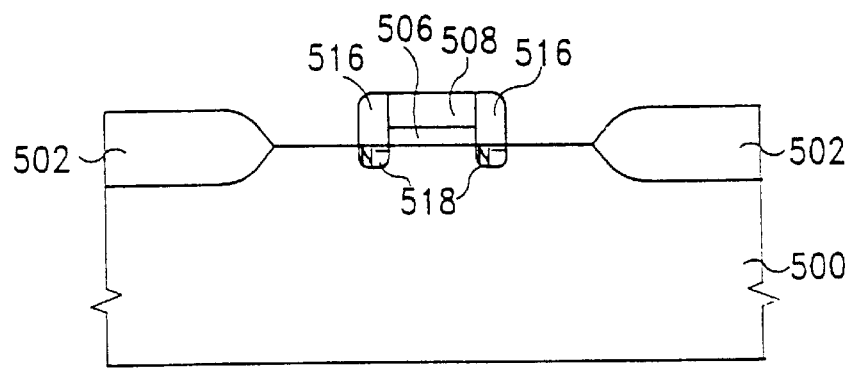

Referring to FIG. 5D, sidewall spacers 516 are formed on the sidewalls of the gate electrode 512 by an anisotropic etching process to etch the phosphoric silicate glass (PSG) 514. Afterwards, a thermal treatment process, such as a rapid thermal annealing or a furnace annealing, is performed. The phosphorous (P) ions in sidewall spacers 516 are driven into the substrate 500 to form the lightly-doped regions (LDD) 518. The impurity concentration of the lightly-doped regions (LDD) 518 is about $10^{17}$ atoms/cm$^3$ to $10^{19}$ atoms/cm$^3$.

Figure 5E:
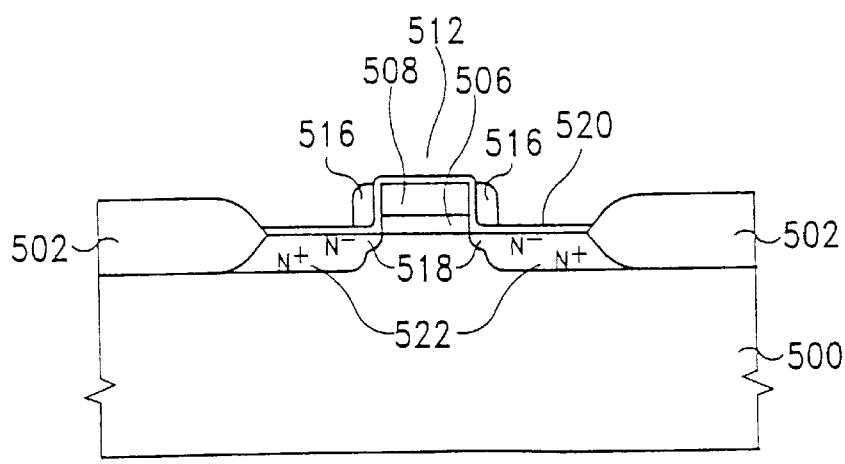

Referring to FIG. 5E, a thermal oxide layer 520 is formed on the gate electrode 512 and the substrate 500 using a dry thermal oxidation process. The temperature of the oxidation is about 800 degrees Centigrade to 1100 degrees Centigrade, and the time of the oxidation is about 30 seconds to 1 hour. The thickness of the thermal oxide layer 520 can range from about 100 to 200 angstroms. The thermal oxide layer 520 can prevent the phosphorous (P) ions of sidewall spacers 516 from sequentially diffusing into the substrate. Therefore, the third method can effectively control impurity concentration of the lightly-doped regions (LDD). Next, sidewall spacers 516 and the gate electrode 512 are utilized as the shielding mask for implanting impurities to form the heavily-doped regions, thereby forming the source/ drain regions 522.

Accordingly, the method of forming LDD by automatic phosphoric silicate glass (PSG) doping is disclosed. The phosphorous (P) ions of the phosphoric silicate glass (PSG) serve as a diffusion source, and are driven into the substrate by high temperature during the thermal annealing process. The present invention can prevent the damage of the substrate, which cause the increasing of leakage current. Additionally, the thermal oxide layer is formed on the surface of the substrate and the gate electrode by the thermal oxidation process. The thermal oxide layer can prevent ions from diffusing into the substrate during the subsequent thermal process. Therefore, the present invention can effectively control the impurity concentration of LDD to prevent the concentration of the lightly-doped regions (LDD) from increasing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a lightly-doped drain on a semiconductor substrate, said method comprising the sequential steps of:

forming a gate oxide layer on said substrate;

forming a polysilicon layer on said gate oxide layer;

forming a photoresist layer on said polysilicon layer to define a gate electrode region;

etching a portion of said polysilicon layer using said photoresist as an etching mask to form a gate electrode;

removing said photoresist layer;

forming a phosphoric silicate glass layer on said gate electrode and said substrate;

performing an annealing process to form a lightly-doped source region and a lightly-doped drain region;

performing a thermal oxidation process to form a thermal oxide layer on said substrate and said gate electrode;

anisotropic etching said phosphoric silicate glass layer to form sidewall spacers on the sidewalls of said gate electrode; and forming a heavily-doped source region and a heavily-doped drain by using said sidewall spacers and said gate electrode as the shielding mask.

2. The method of claim 1, wherein said gate oxide layer is formed to have a thickness in a range of about 40 to 200 angstroms.

3. The method of claim 1, wherein a thickness of said polysilicon layer is in a range of about 500 to 3000 angstroms.

4. The method of claim 1, wherein said phosphoric silicate glass layer is formed by a chemical vapor deposition to have a thickness of about 200 to 2000 angstroms.

5. The method of claim 1, wherein the impurity concentration of said lightly-doped source region and said lightly-doped drain region is about $10^{17}$ atoms/cm$^3$ to $10^{19}$ atoms/cm$^3$.

6. The method of claim 1, wherein said thermal oxide layer is form by using a dry thermal oxidation process, the temperature of the oxidation being about 800 degrees Centigrade to 1100 degrees Centigrade and the time of the oxidation being about 30 seconds to 1 hour, said thermal oxide layer having a thickness in a range of about 100 to 200 angstroms.

7. A method of forming a lightly-doped drain on a semiconductor substrate, said method comprising the sequential steps of:

forming a gate oxide layer on said substrate;

forming a polysilicon layer on said gate oxide layer;

forming a photoresist layer on said polysilicon layer to define a gate electrode region;

etching a portion of said polysilicon layer using said photoresist as an etching mask to form a gate electrode;

removing said photoresist layer;

forming a phosphoric silicate glass layer on said gate electrode and said substrate;

performing an annealing process to form a lightly-doped source region and a lightly-doped drain region;

anisotropic etching said phosphoric silicate glass layer to form sidewall spacers on the sidewalls of said gate electrode;

performing a thermal oxidation process to form a thermal oxide layer on said substrate and said gate electrode; and forming a heavily-doped source region and a heavily-doped drain by using said sidewall spacers and said gate electrode as the shielding mask.

8. The method of claim 7, wherein said gate oxide layer is formed to have a thickness in a range of about 40 to 200 angstroms.

9. The method of claim 7, wherein a thickness of said polysilicon layer is in a range of about 500 to 3000 angstroms.

10. The method of claim 7, wherein said phosphoric silicate glass layer is formed by a chemical vapor deposition to have a thickness of about 200 to 2000 angstroms.

11. The method of claim 7, wherein the impurity concentration of said lightly-doped source region and said lightly-doped drain region is about $10^{17}$ atoms/cm$^3$ to $10^{19}$ atoms/cm$^3$.

12. The method of claim 7, wherein said thermal oxide layer is form by using a dry thermal oxidation process, the temperature of the oxidation being about 800 degrees Centigrade to 1100 degrees Centigrade and the time of the oxidation being about 30 seconds to 1 hour, said thermal oxide layer having a thickness in a range of about 100 to 200 angstroms.

13. A method of forming a lightly-doped drain on a semiconductor substrate, said method comprising the sequential steps of:

forming a gate oxide layer on said substrate;

forming a polysilicon layer on said gate oxide layer;

forming a photoresist layer on said polysilicon layer to define a gate electrode region;

etching a portion of said polysilicon layer using said photoresist as an etching mask to form a gate electrode;

removing said photoresist layer;

forming a phosphoric silicate glass layer on said-gate electrode and said substrate;

anisotropic etching said phosphoric silicate glass layer to form sidewall spacers on the sidewalls of said gate electrode;

performing an annealing process to form a lightly-doped source region and a lightly-doped drain region;

performing a thermal oxidation process to form a thermal oxide layer on said substrate and said gate electrode; and forming a heavily-doped source region and a heavily-doped drain by using said sidewall spacers and said gate electrode as the shielding mask.

14. The method of claim 13, wherein said gate oxide layer is formed to have a thickness in a range of about 40 to 200 angstroms.

15. The method of claim 13, wherein a thickness of said polysilicon layer is in a range of about 500 to 3000 angstroms.

16. The method of claim 13, wherein said phosphoric silicate glass layer is formed by a chemical vapor deposition to have a thickness of about 200 to 2000 angstroms.

17. The method of claim 13, wherein the impurity concentration of said lightly-doped source region and said lightly-doped drain region is about $10^{17}$ atoms/cm$^3$ to $10^{19}$ atoms/cm$^3$.

18. The method of claim 13, wherein said thermal oxide layer is form by using a dry thermal oxidation process, the temperature of the oxidation being about 800 degrees Centigrade to 1100 degrees Centigrade and the time of the oxidation being about 30 seconds to 1 hour, said thermal oxide layer having a thickness in a range of about 100 to 200 angstroms.

* * * * *